(12) United States Patent
Takagi et al.

(10) Patent No.: US 9,660,193 B2
(45) Date of Patent: May 23, 2017

(54) MATERIAL COMPOSITION FOR ORGANIC PHOTOELECTRIC CONVERSION LAYER, ORGANIC PHOTOELECTRIC CONVERSION ELEMENT, METHOD FOR PRODUCING ORGANIC PHOTOELECTRIC CONVERSION ELEMENT, AND SOLAR CELL

(75) Inventors: Hiroshi Takagi, Hachioji (JP); Hirohide Ito, Saitama (JP)

(73) Assignee: KONICA MINOLTA, INC., Tokyo (JP)

( * ) Notice: Subject to any disclaimer, the term of this patent is extended or adjusted under 35 U.S.C. 154(b) by 449 days.

(21) Appl. No.: 13/980,713

(22) PCT Filed: Jan. 10, 2012

(86) PCT No.: PCT/JP2012/050219
§ 371 (c)(1),
(2), (4) Date: Jul. 19, 2013

(87) PCT Pub. No.: WO2012/102066
PCT Pub. Date: Aug. 2, 2012

(65) Prior Publication Data
US 2013/0291944 A1 Nov. 7, 2013

(30) Foreign Application Priority Data

Jan. 25, 2011 (JP) ................................. 2011-012694

(51) Int. Cl.
*H01L 51/00* (2006.01)
*C08K 3/04* (2006.01)
*H01L 51/42* (2006.01)

(52) U.S. Cl.
CPC ............ *H01L 51/0036* (2013.01); *C08K 3/04* (2013.01); *H01L 51/0043* (2013.01);
(Continued)

(58) Field of Classification Search
CPC ............ H01L 51/0036; H01L 51/0043; H01L 51/0094; H01L 51/4253; C08K 3/04;
(Continued)

(56) References Cited

FOREIGN PATENT DOCUMENTS

DE WO 2010079064 A2 * 7/2010 ........... C08G 61/126
DE WO 2011076324 A1 * 6/2011 ......... H01L 51/0003
(Continued)

OTHER PUBLICATIONS

Helegsne et al., "Advanced materials and processes for polymer solar cell devices," J. Mater. Chem., 2010, 20, 36-60.*
(Continued)

*Primary Examiner* — Ling Choi
*Assistant Examiner* — Catherine S Branch
(74) *Attorney, Agent, or Firm* — Cantor Colburn LLP

(57) ABSTRACT

It is an object of the present invention to provide a material composition for a bulk-heterojunction-type organic photoelectric conversion layer having high photoelectric conversion efficiency and durability through formation of a stable phase-separated structure by drying in a short time with high productivity and to provide an organic photoelectric conversion element, a method of producing the organic photoelectric conversion element, and a solar cell. The material composition for an organic photoelectric conversion layer contains at least a p-type conjugated polymer semiconductor material being a copolymer having a main chain including an electron-donating group and an electron-withdrawing group, an n-type organic semiconductor material having electron acceptability, and a solvent. The solvent is represented by a general formula (1).

7 Claims, 3 Drawing Sheets

(52) U.S. Cl.
CPC ............ *C08G 2261/124* (2013.01); *C08G 2261/1412* (2013.01); *C08G 2261/3223* (2013.01); *C08G 2261/3241* (2013.01); *C08G 2261/3243* (2013.01); *C08G 2261/3246* (2013.01); *C08G 2261/344* (2013.01); *C08G 2261/91* (2013.01); *H01L 51/0094* (2013.01); *H01L 51/4253* (2013.01); *Y02E 10/549* (2013.01); *Y02P 70/521* (2015.11)

(58) Field of Classification Search
CPC .... C08G 2261/3243; C08G 2261/3246; C08G 2261/344; C08G 2261/3241; C08G 2261/124; C08G 2261/1412; C08G 2261/3223; C08G 2261/91
See application file for complete search history.

(56) References Cited

FOREIGN PATENT DOCUMENTS

| ES | WO 2010108873 | * | 9/2010 | ........... C07D 487/04 |
|---|---|---|---|---|
| JP | 2007173636 A | | 7/2007 | |
| JP | 2008211165 A | | 9/2008 | |
| JP | 2009212477 A | | 9/2009 | |
| JP | 2010512005 A | | 4/2010 | |
| JP | 2010528119 A | | 8/2010 | |
| WO | 2009113450 A1 | | 9/2009 | |
| WO | 2010021921 A1 | | 2/2010 | |
| WO | 2011019044 A1 | | 2/2011 | |

OTHER PUBLICATIONS

International Preliminary Report on Patentability for International Application No. PCT/JP2012/050219, issued Jul. 30, 2013, with English translation.

Written Opinion of the International Searching Authority for International Application No. PCT/JP2012/050219, mailed Feb. 14, 2012.

International Search Report for International Application No. PCT/JP2012/050219, with English Translation.

Corey V. Hoven et al., "Improved Performance of Polymer Bulk Heterojunction Solar Cells Through the Reduction of Phase Separation via Solvent Additives", Advanced Materials, Feb. 23, 2010, vol. 22, No. 8, E63-E66; 5 pages.

J. Peet et al., "Efficiency enhancement in low-bandgap polymer solar cells by processing with alkane dithiols" Center for Polymers and Organic Solids, University of California at Santa Barbara, Published May 2007; 4 pages.

* cited by examiner

MATERIAL COMPOSITION FOR ORGANIC PHOTOELECTRIC CONVERSION LAYER, ORGANIC PHOTOELECTRIC CONVERSION ELEMENT, METHOD FOR PRODUCING ORGANIC PHOTOELECTRIC CONVERSION ELEMENT, AND SOLAR CELL

This is the U.S. national stage of application No. PCT/JP2012/050219, filed on 10 Jan. 2012. Priority under 35 U.S.C. §119(a) and 35 U.S.C. §365(b) is claimed from Japanese Application No. 2011-012694, filed 25 Jan. 2011, the disclosure of which is also incorporated herein by reference.

TECHNICAL FIELD

The present invention relates to a material composition for an organic photoelectric conversion layer suitable for forming a bulk-heterojunction-type organic photoelectric conversion layer, an organic photoelectric conversion element using the composition, a method for producing the organic photoelectric conversion element, and a solar cell.

BACKGROUND ART

In recent years, a steep rise in prices of fossil fuels has required to develop systems that can generate electric power directly from natural energy resources. For example, solar cells using monocrystalline, polycrystalline, or amorphous silicon (Si), solar cells formed of compounds such as GaAs and CIGS (semiconductor material consisting of copper (Cu), indium (In), gallium (Ga), and selenium (Se)), and dye-sensitized photoelectric conversion elements (Gratzel cells) have been proposed or applied to practical use.

The costs of power generation by these solar cells are, however, still higher than the supply price of electricity generated from fossil fuels. This has precluded spread of the solar cells. In addition, a substrate of heavy glass is necessarily used, which requires reinforcement work for installation. This also raises the power generation cost.

Under such circumstances, a bulk-heterojunction-type photoelectric conversion element having a photoelectric conversion layer composed of a blend of an electron donor layer (p-type semiconductor layer) and an electron acceptor layer (n-type semiconductor layer) sandwiched between a transparent electrode and a counter electrode have been proposed as a solar cell that can generate electricity at a lower cost than that in power generation using fossil fuels, and a photoelectric conversion efficiency exceeding 5% has been reported (e.g., see Non-Patent Literature 1).

Such a bulk-heterojunction-type solar cell, other than the anode and the cathode, is formed by an application method. The bulk-heterojunction-type solar cell is therefore expected to be produced readily at low cost and become a potential solution to the high-cost power generation described above. In addition, unlike other solar cells such as the above-mentioned Si solar cells, compound semiconductor solar cells, and dye-sensitized solar cells, the process of producing the bulk-heterojunction-type solar cell does not involve any step requiring a high temperature of 160° C. or more. Such a process will enable the use of plastic substrates which are inexpensive and light-weight.

A further reduction in the power generation cost, however, requires higher photoelectric conversion efficiency, and materials for higher efficiency have been developed. The methods of increasing efficiency that have been reported necessarily include treatment such as annealing, after formation of a coating film of a bulk-heterojunction-type photoelectric conversion layer, for stabilizing the phase-separated structure of the electron donor layer (p-type semiconductor layer) and the electron acceptor layer (n-type semiconductor layer) and thus have a disadvantage of low productivity. Another disadvantage is low durability due to its instable and readily variable phase-separated structure over time despite high initial photoelectric conversion efficiency.

Methods of increasing the efficiency by forming an appropriate phase-separated structure using a solvent in an application process for forming a bulk-heterojunction-type photoelectric conversion layer have also been disclosed. For example, a method using both chlorobenzene and dichlorobenzene (e.g., see Patent Literature 1), a method using a good solvent for an electron-donating conjugated compound and an electron-accepting organic semiconductor and an amide solvent having a relative dielectric constant of 33 or more (e.g., see Patent Literature 2), a method using a solvent having a boiling point of 50 to 200° C. and a solvent having a boiling point of 150 to 300° C. (e.g., see Patent Literature 3), a method using a solvent composed of a substituted alkane (e.g., see Patent Literature 4), and a method using a solvent of a halogen-free carbocyclic compound (e.g., see Patent Literature 5) are disclosed. These methods, however, have several problems on the instable phase-separated structure, in particular, instable formation of a coating film in a short drying time in order to increase the productivity.

Accordingly, for the bulk-heterojunction-type photoelectric conversion layer, a high productivity has been requested in a roll-to-roll coating process applied to a plastic substrate, and development of an efficient method for forming a stable phase-separated structure by short-time drying has been desired.

CITATION LIST

Patent Literature

[Patent Literature 1] Japanese Unexamined Patent Application Publication No. 2007-173636
[Patent Literature 2] Japanese Unexamined Patent Application Publication No. 2008-211165
[Patent Literature 3] Japanese Unexamined Patent Application Publication No. 2009-212477
[Patent Literature 4] National Publication of International Patent Application No. 2010-512005
[Patent Literature 5] International Publication No. 10/021921

Non-Patent Literature

[Non-Patent Literature 1] A. Heeger et al., Nature Mat., vol. 6 (2007), p. 497

SUMMARY OF THE INVENTION

Technical Problem

It is an object of the present invention, which has made in view of the above-mentioned problems, to provide a material composition for a bulk-heterojunction-type organic photoelectric conversion layer having high photoelectric conversion efficiency and durability through formation of a stable phase-separated structure by drying in a short time with high productivity and to provide an organic photoelectric conversion element, a method of producing the organic photoelectric conversion element, and a solar cell.

Means to Solve the Problem

The object of the present invention can be achieved by the following aspects.

1. A material composition for an organic photoelectric conversion layer including a p-type conjugated polymer semiconductor material being a copolymer having a main chain including an electron-donating group and an electron-withdrawing group, an n-type organic semiconductor material having electron acceptability, and a solvent. The solvent includes a compound represented by a general formula (1).

[Chem. 1]

General formula (1)

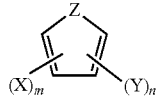

(where Z represents an oxygen atom, a sulfur atom, CH═C (CH$_3$), or CH═C(C$_2$H$_5$); X represents a halogen atom; Y represents a methyl group; m represents 1 or 2; and n represents 0 or 1).

2. The material composition for an organic photoelectric conversion layer of aspect 1, in which the solvent represented by the general formula (1) is toluene or xylene substituted by a Cl or Br atom.

3. The material composition for an organic photoelectric conversion layer of aspect 1, in which the solvent represented by the general formula (1) is thiophene or furan substituted by a Cl or Br atom.

4. An organic photoelectric conversion element including a first electrode; an organic photoelectric conversion layer prepared through coating and drying of the material composition for an organic photoelectric conversion layer of any one of aspects 1 to 3; and a second electrode; on a substrate.

5. A method for producing an organic photoelectric conversion element, including a step of applying the material composition for an organic photoelectric conversion layer of any one of aspects 1 to 3, which is heated to 50° C. or more, onto a substrate having a first electrode; and a step of drying the applied material composition at 90° C. or more to form an organic photoelectric conversion layer.

6. A solar cell including an organic photoelectric conversion element of aspect 4.

7. A solar cell including an organic photoelectric conversion element prepared by the method for producing an organic photoelectric conversion element of aspect 5.

Advantageous Effects of the Invention

The present invention can provide a material composition for a bulk-heterojunction-type organic photoelectric conversion layer having high photoelectric conversion efficiency and durability through formation of a stable phase-separated structure by drying in a short time with high productivity and can provide an organic photoelectric conversion element, a method of producing the organic photoelectric conversion element, and a solar cell.

EMBODIMENTS TO CARRY OUT THE INVENTION

Figure 1:
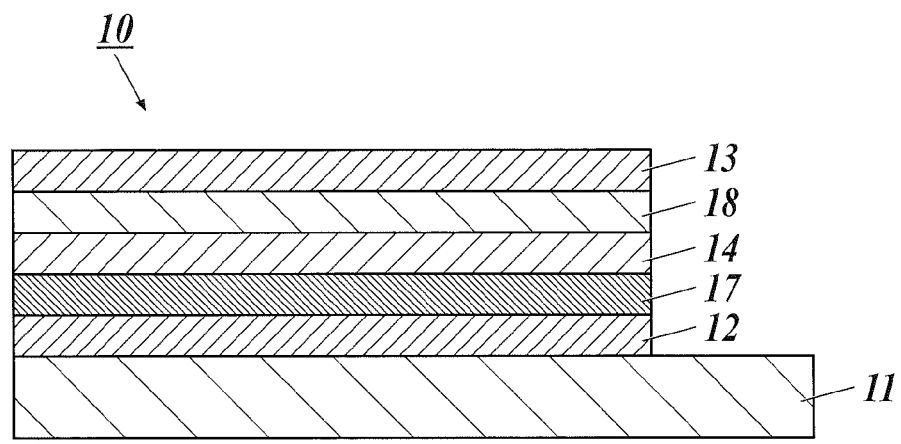
FIG. 1 is a cross-sectional view of an example of a solar cell composed of an organic photoelectric conversion element having a normal-order layer structure.

Typical embodiments for implementing the present invention will now be described, but the invention should not be limited thereto.

The present inventors, who have diligently investigated solutions to the above-mentioned problems, have found that high photoelectric conversion efficiency and durability of a photoelectric conversion layer can be achieved even by short-time drying in formation of the photoelectric conversion layer with a photoelectric conversion layer-forming composition containing a p-type conjugated polymer semiconductor material being a copolymer having a main chain including an electron-donating group and an electron-withdrawing group, an n-type organic semiconductor material having electron acceptability, and a solvent having a specific structure.

Light incident on a bulk-heterojunction-type photoelectric conversion layer composed of a mixture of a p-type organic semiconductor material and an n-type organic semiconductor material excites electrons in the p-type organic semiconductor material from the highest occupied molecular orbital (hereinafter, referred to as "HOMO") to the lowest unoccupied molecular orbital (hereinafter, referred to as "LUMO"). The electrons move to the conduction band of the n-type organic semiconductor material and then transferred to the conduction band of the p-type conjugated polymer through the external circuit. The electrons generated in the conduction band of the p-type conjugated polymer move to the LUMO level.

At the same time, the incident light generates holes at the HOMO level of the p-type organic semiconductor material, and the holes move to the valence band of the n-type organic semiconductor material through the external circuit. Thus, a photocurrent flows in the bulk-heterojunction-type photoelectric conversion layer. It is believed that such photocharge separation is enhanced by an increase in the contact interface between the p-type organic semiconductor material and the n-type organic semiconductor material.

In the bulk-heterojunction-type photoelectric conversion layer composed of a mixture of a p-type organic semiconductor material and an n-type organic semiconductor material, it is known that annealing treatment by heating of a photoelectric conversion layer formed by coating of the mixture solution accelerates the crystallization of the p-type organic semiconductor material, forms an n-type organic semiconductor material microphase-separated structure, and enlarges the contact interface between the p-type organic semiconductor material and the n-type organic semiconductor material to enhance the conversion efficiency. The organic photoelectric conversion layer formed by such a method, however, has a problem of a long stabilization time after the formation of an appropriate phase-separated structure. The present inventors, who have diligently investigated solutions to the above-mentioned problem, have surmised that a stable phase-separated structure can be promptly formed by coating the organic photoelectric conversion layer material composition including the solvent having the specific structure according to the present invention.

The details of the material composition for an organic photoelectric conversion layer of the present invention and each component elements of the organic photoelectric conversion element using the composition and the solar cell using the composition will now be described in turn.

[Constitution of Organic Photoelectric Conversion Element and Solar Cell]

FIG. 1 is a cross-sectional view of an example of a bulk-heterojunction-type organic photoelectric conversion element having a normal-order layer structure. In FIG. 1, the bulk-heterojunction-type organic photoelectric conversion element 10 is composed of a transparent electrode (usually anode) 12, a hole transfer layer 17, a photoelectric conversion layer 14, an electron transfer layer 18, and a counter electrode (usually cathode) 13 which are stacked in this order on a substrate 11.

The substrate 11 is a member for holding the transparent electrode 12, the photoelectric conversion layer 14, and the counter electrode 13 stacked in this order thereon. In this embodiment, since light to be photoelectrically converted enters the element from the substrate 11 side, the substrate 11 is a member that can transmit the light to be photoelectrically converted, i.e., a member that is transparent for wavelengths of the light to be photoelectrically converted. The substrate 11 used is, for example, a glass substrate or a transparent resin substrate. The substrate 11 is not indispensable. For example, the bulk-heterojunction-type organic photoelectric conversion element 10 may consist of a transparent electrode 12, a counter electrode 13, and a photoelectric conversion layer 14 disposed therebetween.

The photoelectric conversion layer 14 converts light energy into electrical energy and consists of a homogeneous mixture of a p-type organic semiconductor material and an n-type organic semiconductor material. The p-type organic semiconductor material relatively functions as an electron donor, and the n-type organic semiconductor material relatively functions as an electron acceptor.

Herein, the electron donor and the electron acceptor are "an electron donor and an electron acceptor that absorb light to form a pair of a hole and an electron (a charge separation state) by the transfer of an electron from the electron donor to the electron acceptor", that is, donate or accept an electron by photoreaction, and differ from electrodes, which merely donate or accept electrons.

In FIG. 1, light entered from the transparent electrode 12 through the substrate 11 is absorbed by the electron acceptor or the electron donor in the photoelectric conversion layer 14. As a result, electrons transfer from the electron donors to the electron acceptors to form pairs of holes and electrons (charge separation state). The electrons pass between the electron acceptors and the holes pass between the electron donors, and they are transported to the different electrodes by the internal electric field, e.g., the potential difference between the transparent electrode 12 and the counter electrode 13 in the case where the work function of the transparent electrode 12 differs from that of the counter electrode 13. As a result, the generated charge is detected in the form of a photocurrent.

Since the transparent electrode 12 usually has a larger work function than that of the counter electrode 13, holes are transported to the transparent electrode 12 whereas electrons are transported to the counter electrode 13.

If the work function values are reversed, a reverse-layer structure is formed to transport electrons and holes to the reverse directions.

Figure 2:
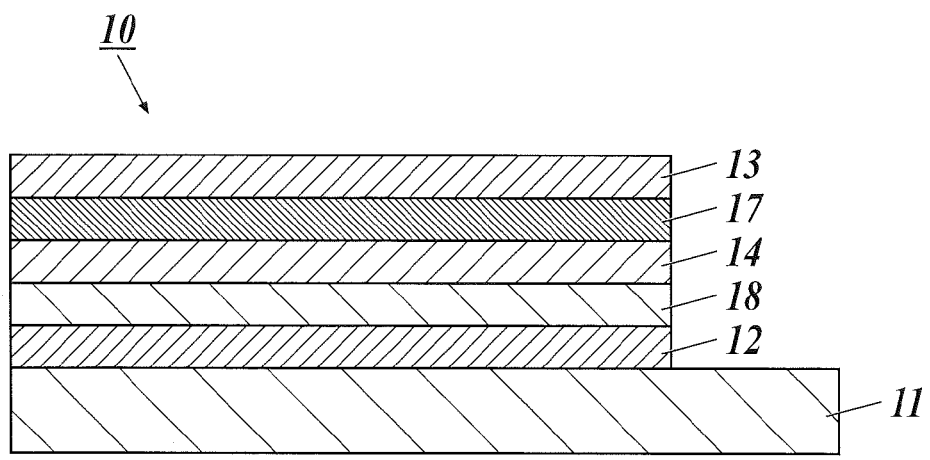
FIG. 2 is a cross-sectional view of an example of a solar cell composed of an organic photoelectric conversion element having a reverse-layer structure.

FIG. 2 is a cross-sectional view of an example of a bulk-heterojunction-type organic photoelectric conversion element having a reverse-layer structure. As described above, the work function values are reversed and the positions of the hole transfer layer 17 and the electron transfer layer 18 are also reversed compared with the structure shown in FIG. 1.

The photoelectric conversion element optionally includes other layers, such as a hole-blocking layer, an electron-blocking layer, an electron-injecting layer, a hole-injecting layer, and a planarization layer, which are not shown in FIGS. 1 and 2.

Figure 3:
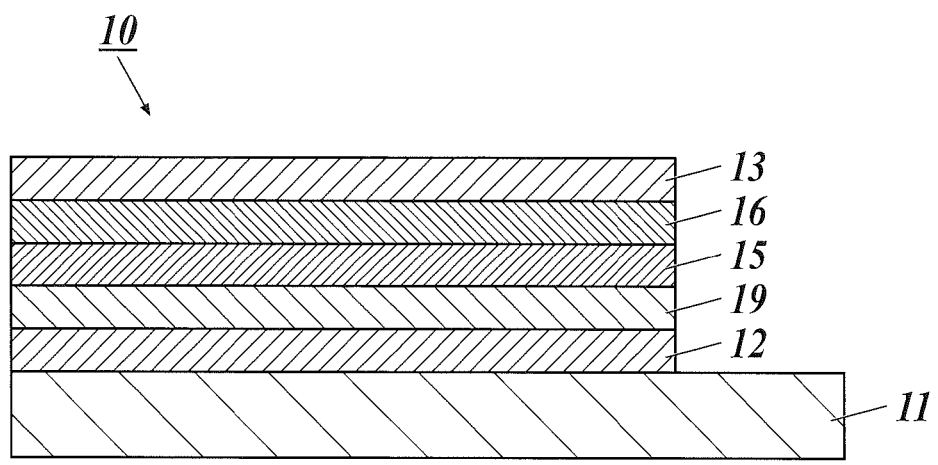
FIG. 3 is a cross-sectional view of an example of a solar cell composed of an organic photoelectric conversion element having a tandem-type photoelectric conversion layer.

In order to enhance the sunlight utilization efficiency (photoelectric conversion efficiency), such photoelectric conversion elements may be stacked to form a tandem structure. FIG. 3 is a cross-sectional view of an example of an organic photoelectric conversion element including a tandem-type photoelectric conversion layer.

The tandem structure can be formed by stacking a transparent electrode 12, a first organic photoelectric conversion layer 19, a charge recombination layer 15, a second organic photoelectric conversion layer 16, and a counter electrode 13 in this order on a substrate 11. The absorption spectra of the second organic photoelectric conversion layer 16 and the first organic photoelectric conversion layer 19 may be the same or different. Preferably, they are different from each other. Furthermore, a hole transfer layer 17 or an electron transfer layer 18 may be disposed between the first organic photoelectric conversion layer 19 or the second organic photoelectric conversion layer 16 and each electrode. In the present invention, however, each organic photoelectric conversion layer preferably has a structure as shown in FIG. 2 even in the tandem structure.

In the present invention, the photoelectric conversion layer is formed of a material composition for an organic photoelectric conversion layer containing a p-type conjugated polymer semiconductor material being a copolymer having a main chain including an electron-donating group and an electron-withdrawing group, an n-type organic semiconductor material having electron acceptability, and a solvent having a specific structure. The photoelectric conversion layer can thereby have enhanced conversion efficiency and durability even if it is formed through drying in a short time.

Each constituent material of the material composition for an organic photoelectric conversion layer of the present invention will now be described.

[Solvent]

The material composition for an organic photoelectric conversion layer of the present invention contains a solvent represented by a general formula (1) according to the present invention. The material composition can achieve high conversion efficiency and durability even in drying in a short time by containing such a solvent and facilitates the formation of a stable phase-separated structure.

In the general formula (1), Z represents an oxygen atom, a sulfur atom, $CH=C(CH_3)$, or $CH=C(C_2H_5)$; X represents a halogen atom; Y represents a methyl group; m represents 1 or 2; and n represents 0 or 1.

Examples of the solvent represented by the general formula (1) include chlorotoluenes, dichlorotoluenes, chloroxylenes, bromotoluenes, dibromotoluenes, bromoxylenes, bromoethylbenzenes, fluorotoluenes, fluoroxylenes, iodotoluenes, iodoxylenes, chlorothiophenes, bromothiophenes, iodothiophenes, chloromethylthiophenes, bromomethylthiophenes, and bromofurans.

Preferred examples of the solvent are chlorotoluenes, chloroxylenes, bromotoluenes, bromoxylenes, chlorothiophenes, bromothiophenes, and bromofurans.

The preferred chlorotoluenes are 2-chlorotoluene, 3-chlorotoluene, and 4-chlorotoluene.

Preferred examples of the chloroxylenes include 3-chloro-o-xylene, 4-chloro-o-xylene, 2-chloro-m-xylene, and 4-chloro-m-xylene.

Examples of the bromotoluenes include 2-bromotoluene and 3-bromotoluene.

Examples of the bromoxylenes include 3-bromo-o-xylene, 4-bromo-o-xylene, 2-bromo-m-xylene, and 4-bromo-m-xylene.

Examples of the chlorothiophenes include 2-chlorothiophene and 3-chlorothiophene.

Examples of the bromothiophenes include 2-bromothiophene and 3-bromothiophene.

Examples of the bromofurans include 3-bromofuran.

The solvent is more preferably 2-chlorotoluene, 3-chlorotoluene, 3-chloro-o-xylene, 4-chloro-o-xylene, 2-bromotoluene, 3-bromotoluene, 3-chlorothiophene, 3-bromothiophene, or 3-bromofuran.

The solvents represented by the general formula (1) may be used alone or as a mixture of two or more thereof.

The material composition for an organic photoelectric conversion layer of the present invention may further contain another solvent within a range that does not impair the intended effects of the invention. Examples of the optional solvent include chlorobenzenes, dichlorobenzenes, bromobenzenes, fluoroform, toluene, xylene, trichlorobenzenes, fluoronaphthalenes, and methylnaphthalenes.

In a combination with an optional solvent, the preferable mass ratio of the solvent represented by the general formula (1) to the optional solvent is in the range of 51:49 to 99:1.

The amount of the solvent represented by the general formula (1) according to the present invention is preferably in a range of 43 to 99% by mass to the total mass of the material composition for an organic photoelectric conversion layer.

[P-Type Conjugated Polymer Semiconductor Material]

The p-type conjugated polymer semiconductor material used for the organic photoelectric conversion layer (hereinafter, also referred to as bulk-heterojunction layer) according to the present invention is preferably a copolymer having a main chain including electron-donating groups (donor unit) and electron-withdrawing groups (acceptor unit) and having a small band gap. Such a copolymer can efficiently absorb radiant energy over a broad range of a sunlight spectrum. Usable examples of such a copolymer include known conjugated polymer materials.

Examples of the acceptor unit include quinoxaline skeletons, pyrazinoquinoxaline skeletons, benzothiadiazole skeletons, benzoxadiazole skeletons, benzoselenadiazole skeletons, benzotriazole skeletons, pyridothiadiazole skeletons, thienopyrazine skeletons, phthalimide skeletons, 3,4-thiophenedicarboxylic acid imide skeletons, isoindigo skeletons, thienothiophene skeletons, diketopyrrolopyrrole skeletons, 4-acyl-thieno[3,4-b]thiophene skeletons, and pyrazolo[5,1-c][1,2,4]triazole skeletons.

Any donor unit that has a lower LUMO level or HOMO level than that of, for example, a hydrocarbon aromatic ring (e.g., benzene, naphthalene, or anthracene) having the same number of pi ($\pi$) electrons can be used.

More preferably, the donor unit has a structure including a five-membered hetero ring, such as a thiophene ring, a furan ring, a pyrrole ring, cyclopentadiene, or silacyclopentadiene, or a fused ring thereof.

Specific examples of the donor unit include fluorene, silafluorene, carbazole, dithienocyclopentadiene, dithienosilacyclopentadiene, dithienopyrrole, and benzodithiophene.

The donor unit is more preferably a structure represented by a general formula (2):

[Chem. 2]

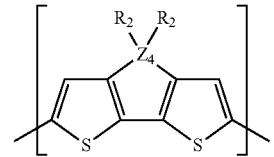

General formula (2)

In the general formula (2), $Z_4$ represents a carbon atom, a silicon atom, or a germanium atom; and each $R_2$ represents an alkyl group, a fluorinated alkyl group, a cycloalkyl group, an aryl group, a heteroaryl group, or an alkylsilyl group and is optionally substituted, where two $R_2$s optionally bond to each other to form a ring and may be the same or different.

Structures represented by general formula (3) are also preferred.

[Chem. 3]

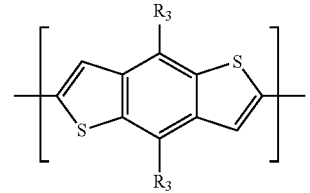

General formula (3)

In general formula (3), each $R_3$ represents an alkyl group, an alkylether group, or an alkylester group and is optionally substituted, where two $R_3$s optionally bond to each other to form a ring and may be the same or different.

In such a structure, fused thiophene rings, which have high mobility, give a large $\pi$ (pi) conjugate plane through fusion and have solubility resulting from substituent groups. Accordingly, the structure can achieve both solubility and high mobility and is thereby expected to have further enhanced photoelectric conversion efficiency.

Preferred examples of the p-type conjugated polymer semiconductor material include polythiophene copolymers such as polythiophene-thienothiophene copolymers described in Nature Material, (2006) vol. 5, p. 328, polythiophene-diketopyrrolopyrrole copolymers described in International Publication No. WO08/000,664, polythiophene-thiazorothiazole copolymers described in Adv. Mater., 2007, p. 4160, and cyclopentadithiophene derivatives (poly[2,6]-(4,4-bis-(2-ethylhexyl)-4H-cyclopenta[2,1-b; 3,4-b']dithiophene)-alt-4,7-(2,1,3-benzothiadiazole, PCPDTBT) described in Nature Mat., vol. 6 (2007), p. 497. In particular, the polythiophene copolymers such as PCPDTBT are preferred.

The p-type conjugated polymer semiconductor material according to the present invention preferably has a number-average molecular weight of 5000 to 500000. The number-average molecular weight of higher than 5000 causes an effect of increasing the fill factor, whereas the number-average molecular weight of lower than 500000 results in high solubility and high productivity.

The number-average molecular weight is more preferably 10000 to 100000 and most preferably 15000 to 50000.

Throughout the present invention, the number-average molecular weight can be measured by gel permeation chromatography (GPC). Purification depending on the number-average molecular weight can also be performed by fractional gel permeation chromatography (GPC).

The band gap is preferably 1.8 eV or less, more preferably 1.6 to 1.1 eV. A band gap of higher than 1.1 eV readily provides an open circuit voltage, Voc (V), leading to high conversion efficiency.

[N-Type Organic Semiconductor Material]

Any n-type organic semiconductor material having electron acceptability can be used for the bulk-heterojunction layer according to the present invention, and examples thereof include fullerene, octaazaporphyrin, perfluoro forms of p-type semiconductors in which hydrogen atoms are replaced with fluorine atoms (e.g., perfluoropentacene and perfluorophthalocyanine), and polymer compounds containing skeletons of aromatic carboxylic acid anhydrides or imides, such as naphthalenetetracarboxylic anhydride, naphthalenetetracarboxylic diimide, perylenetetracarboxylic anhydride, and perylenetetracarboxylic diimide.

Particularly preferred are fullerene derivatives that can rapidly (50 fs or less) and efficiently perform charge separation with various p-type organic semiconductor materials. Examples of the fullerene derivative include fullerene C60, fullerene C70, fullerene C76, fullerene C78, fullerene C84, fullerene C240, fullerene C540, mixed fullerene, fullerene nanotubes, multilayer nanotubes, monolayer nanotubes, and nanohorns (cone type); and these fullerene derivatives partially substituted by, for example, hydrogen atoms, halogen atoms, substituted or unsubstituted alkyl groups, alkenyl groups, alkynyl groups, aryl groups, heteroaryl groups, cycloalkyl groups, silyl groups, ether groups, thioether groups, amino groups, and silyl groups.

In particular, fullerene derivatives having substituents and showing higher solubility are preferred, and examples thereof include [6,6]-phenyl-C61-butyric acid methyl ester (abbreviation: PCBM), [6,6]-phenyl-C61-butyric acid n-butyl ester (abbreviation: PCBnB), [6,6]-phenyl-C61-butyric acid isobutyl ester (abbreviation: PCBiB), [6,6]-phenyl-C61-butyric acid n-hexyl ester (abbreviation: PCBH), [6,6]-phenyl-C71-butyric acid methyl ester (abbreviation: PC71BM), bis-PCBM described in Adv. Mater., vol. 20 (2008), p. 2116, aminated fullerene described in Japanese Unexamined Patent Application Publication No. 2006-199674, metallocene fullerene described in Japanese Unexamined Patent Application Publication No. 2008-130889, and fullerene having a cyclic ether group described in U.S. Pat. No. 7,329,709.

[Method of Forming Organic Photoelectric Conversion Layer]

The organic photoelectric conversion layer according to the present invention is preferably formed by coating of a material composition for an organic photoelectric conversion layer containing a p-type organic semiconductor material, an n-type organic semiconductor material, and a solvent represented by the general formula (1) according to the present invention.

The application may be performed by any method, and examples thereof include casting, spin coating, blade coating, wire bar coating, gravure coating, spray coating, dipping coating, bead coating, air knife coating, curtain coating, printing such as ink jetting, screen printing, relief printing, intaglio printing, offset printing, and flexographic printing, and usual wet coating such as a Langmuir-Blodgett (LB) technique. In particular, blade coating is most preferred.

The material composition for an organic photoelectric conversion layer containing a solvent represented by the general formula (1) according to the present invention can promptly form a stable phase-separated structure by short-time drying. In order to save the drying time, the coating solution is preferably warmed to a high temperature, preferably, in a range of 50° C. or more and 120° C. or less; and drying is preferably performed at a temperature of 90° C. or more.

In the organic photoelectric conversion layer according to the present invention, the mass ratio of the p-type organic semiconductor material to the n-type organic semiconductor material is preferably in a range of 2:8 to 8:2 and more preferably 4:6 to 6:4. The organic photoelectric conversion layer according to the present invention preferably has a thickness in a range of 50 to 400 nm and more preferably 80 to 300 nm.

A concentration of solid content of the material composition for an organic photoelectric conversion layer used in the application varies depending on the coating process and the thickness of the layer, and is preferably 1 to 15% by mass and more preferably 1.5 to 10% by mass.

[Electron-Transporting Layer/Hole-Blocking Layer]

The organic photoelectric conversion element of the present invention can more efficiently extract the charge generated in the bulk-heterojunction layer by disposing an electron transfer layer between the bulk-heterojunction layer and the cathode and therefore preferably has an electron transfer layer or a hole-blocking layer.

A general material constituting the electron transfer layer is, for example, octaazaporphyrin or a perfluoro form of the p-type semiconductor (e.g., perfluoropentacene or perfluorophthalocyanine). Similarly, the electron transfer layer having a deeper HOMO level than that of the p-type organic semiconductor material used for the bulk-heterojunction layer has a hole-blocking function having a rectifying effect to prevent the holes generated in the bulk-heterojunction layer from flowing toward the cathode side. More preferably, a material having a deeper HOMO level than that of the n-type semiconductor is used for the electron transfer layer. In addition, a compound having high electron mobility is preferred in light of characteristics of transporting electrons.

Such an electron transfer layer is also called a hole-blocking layer, and a compound having such a hole-blocking function is preferably used for the electron transfer layer. Examples of the material having such a function include phenanthrene compounds such as bathocuproine; n-type semiconductor materials such as naphthalenetetracarboxylic acid anhydride, naphthalenetetracarboxylic acid diimide, perylenetetracarboxylic acid anhydride, and perylenetetracarboxylic acid diimide; n-type inorganic oxides such as titanium oxide, zinc oxide, and gallium oxide; and alkali metal compounds such as lithium fluoride, sodium fluoride, and cesium fluoride. The electron transfer layer may be made of a single material of the n-type organic semiconductor material used for the bulk-heterojunction layer.

These layers may be formed by either vacuum deposition or solution coating and is preferably formed by solution coating.

[Hole Transfer Layer/Electron-Blocking Layer]

The organic photoelectric conversion element of the present invention can more efficiently extract the charge generated in the bulk-heterojunction layer by disposing a hole transfer layer between the bulk-heterojunction layer and the anode. The element therefore preferably includes these layers.

Examples of material usable for constituting the hole transfer layer include polyethylene dioxythiophene (PEDOT) such as Baytron P (trade name) manufactured by H.C. Starck-V TECH Ltd., polyaniline and its doped material, and cyan compounds described in International Publication No. WO2006/019270. A hole transfer layer having a lower LUMO level than that of the n-type semiconductor material used for the bulk-heterojunction layer has an electron-blocking function having a rectifying effect to prevent the electrons generated in the bulk-heterojunction layer from flowing toward the anode side. The hole transfer layer having such a function is also called an electron-blocking layer, and the element preferably includes the electron-blocking layer. Examples of the material constituting the electron-blocking layer include triarylamine compounds described in Japanese Unexamined Patent Application Publication No. Hei 5-271166; and metal oxides such as molybdenum oxide, nickel oxide, and tungsten oxide. The hole transfer layer may be made of a single material of the p-type semiconductor material used for the bulk-heterojunction layer.

These layers may be formed by either vacuum deposition or solution coating and is preferably formed by solution coating. Formation of an underlying primary layer prior to formation of the bulk-heterojunction layer can level the coating surface and thus can preferably decrease adverse effects such as leakage.

[Other Layers]

In order to enhance the energy conversion efficiency or improve the element lifetime, the element may have a structure including various intermediate layers. Examples of the intermediate layer include a hole-injecting layer, electron-injecting layer, exciton-blocking layer, UV-absorbing layer, light-reflecting layer, and wavelength-converting layer. Furthermore, in order to further stabilize metal oxide microparticles localized in an upper layer, the element may have a layer containing, for example, a silane coupling agent. Furthermore, a metal oxide-containing layer may be disposed adjacent to the bulk-heterojunction-type organic photoelectric conversion layer according to the present invention.

[Electrode]

The organic photoelectric conversion element of the present invention at least includes an anode and a cathode (a first electrode and a second electrode, respectively). A tandem structure can be achieved by disposing an intermediate electrode. In the present invention, an electrode into which holes mainly flow is called the anode, and an electrode into which electrons mainly flow is called the cathode.

Electrodes may be differently called based on light transmissibility. An electrode having light transmissibility may be called a transparent electrode whereas an electrode not having light transmissibility may be called a counter electrode. In general, the anode has light transmissibility and should therefore be a transparent electrode whereas the cathode does not have light transmissibility and is a counter electrode.

(Anode)

The anode according to the present invention is preferably an electrode transmitting light of 380 to 800 nm. Examples of the material constituting the anode include transparent conductive metal oxides such as indium tin oxide (ITO), $SnO_2$, and ZnO; a thin film of metal such as gold, silver, and platinum; metal nanowires; and carbon nanotubes.

In addition, the material can be, for example, a conductive polymer selected from the group consisting of derivatives of polypyrrole, polyaniline, polythiophene, poly(thienylene vinylene), polyazulene, polyisothianaphthene, polycarbazole, polyacetylene, polyphenylene, poly(phenylene vinylene), polyacene, polyphenylacetylene, polydiacetylene, and polynaphthalene. The anode may be formed of a combination of these conductive compounds.

(Cathode)

The cathode may be a single layer consisting of a conductive material or may include a resin supporting the conductive material. Examples of usable electrically conductive material of the cathode include metals having a small work function (4 eV or less), alloys, electrically conductive compounds, and mixtures thereof. Specific examples of the electrode material include sodium, sodium-potassium alloys, magnesium, lithium, magnesium/copper mixture, magnesium/silver mixture, magnesium/aluminum mixture, magnesium/indium mixture, aluminum/aluminum oxide ($Al_2O_3$) mixture, indium, lithium/aluminum mixture, and rare earth metals. Among these materials, preferred are mixtures of a first metal and a second metal, where the second metal has a larger work function than that of the first metal and is stable from the viewpoints of performance of extracting electrons and durability against oxidation. Examples of the mixture include a magnesium/silver mixture, magnesium/aluminum mixture, magnesium/indium mixture, aluminum/aluminum oxide ($Al_2O_3$) mixture, and lithium/aluminum mixture. The cathode can be formed by, for example, vapor deposition or sputtering in the form of a thin film of such an electrode material. The thin film usually has a thickness in a range of 10 nm to 5 μm and preferably 50 to 200 nm.

A metal material as the conductive material of the cathode can reflect the light reached on the cathode toward the first electrode side to reuse the reflected light, which is reabsorbed by the organic photoelectric conversion layer. Thus, the use of a metal material is preferred from the viewpoint of further enhancing the photoelectric conversion efficiency.

The cathode may be composed of a metal (e.g., gold, silver, copper, platinum, rhodium, ruthenium, aluminum, magnesium, or indium) and nanoparticles, nanowires, or nanostructure of carbon. A dispersion of nanowires allows formation of a transparent and highly conductive cathode by coating and is therefore preferred.

In the case of a transparent cathode, a light transmissive cathode can be produced, for example, by forming a thin film having a thickness of about 1 to 20 nm from a conductive material suitable for a cathode such as aluminum, an aluminum alloy, silver, or a silver compound, and then further providing a film of a conductive light transmissive material exemplified in the description of the anode.

(Intermediate Electrode)

The material for the intermediate electrode (charge recombination layer), which is essential for a tandem structure as shown in FIG. 3, is preferably a layer of a compound having transparency and electrical conductivity, and usable examples thereof include materials exemplified in the description of the anode (e.g., transparent metal oxides such as ITO, AZO, FTO, and titanium oxide; very thin layer of metal such as Ag, Al, and Au; layers containing nanoparticles or nanowires; and conductive polymer materials such as [poly(ethylene dioxythiophene) (PEDOT):poly(styrene sulfonate) (PSS)] and polyaniline).

An appropriate laminate of a hole transfer layer and an electron transfer layer can function as an intermediate electrode (charge recombination layer). Such a structure can omit one film-forming step and is therefore preferred.

[Substrate]

In the case of receiving light to be photoelectrically converted from a side of a substrate, the substrate can preferably transmit the light to be photoelectrically converted, i.e., is transparent for wavelengths of the light to be photoelectrically converted. Preferred examples of the substrate include glass substrates and resin substrates, and a transparent resin film is desirable from the viewpoints of light-weight and flexibility.

Any transparent resin film can be preferably used as a transparent substrate in the present invention. For example, the material, shape, structure, and thickness of the film can be appropriately selected from known ones. Examples of the film include polyester resin films such as polyethylene telephthalate (PET) and polyethylene naphthalate (PEN) modified polyester films; polyethylene (PE) resin films; polypropylene (PP) resin films; polystyrene resin films; polyolefin resin films such as cyclic olefin resin films; vinyl resin films such as polyvinyl chloride and polyvinylidene chloride films; polyether ether ketone (PEEK) resin films; polysulfone (PSF) resin films; polyether sulfone (PES) resin films; polycarbonate (PC) resin films; polyamide resin films; polyimide resin films; acrylic resin films; and triacetyl cellulose (TAC) resin films, but any resin film having a transmittance of 80% or more at visible wavelength range (380 to 800 nm) can be preferably applied to the transparent resin film according to the present invention. In particular, from the viewpoints of transparency, heat resistance, workability, strength, and cost, preferred are biaxially stretched polyethylene telephthalate films, biaxially stretched polyethylene naphthalate films, polyether sulfone films, and polycarbonate films; and more preferred are biaxially stretched polyethylene telephthalate films and biaxially stretched polyethylene naphthalate films.

The transparent substrate used for the present invention may be subjected to a surface treatment or provided with an adhesion promoting layer for ensuring wettability and adhesiveness of the coating solution. The surface treatment and the adhesion promoting layer can be provided by known techniques. Examples of the surface treatment include surface activation treatments such as corona discharge treatment, flame treatment, ultraviolet ray treatment, high frequency treatment, glow discharge treatment, active plasma treatment, and laser treatment. Examples of the adhesion promoting layer include layers of polyester, polyamide, polyurethane, vinyl copolymers, butadiene copolymers, acrylic copolymers, vinylidene copolymers, and epoxy copolymers.

Furthermore, in order to inhibit permeation of oxygen and water vapor, the transparent substrate may be preliminarily covered with a barrier coat layer. Alternatively, a hard coat layer may be provided on a side opposite to the side on which a transparent conductive layer is transferred.

[Optically Functional Layer]

The organic photoelectric conversion element of the present invention may include various optically functional layers for receiving sunlight more efficiently. As the optically functional layer, for example, an antireflection film, a light-condensing layer such as a microlens array, or a light diffusion layer that can scatter the light reflected by the cathode such that the light reenters the power generation layer may be provided.

Various known antireflection layers can be used. For example, if the transparent resin film is a biaxially stretched polyethylene telephthalate film, the interfacial reflection between the film substrate and the adhesion promoting layer adjacent to the film can be reduced by adjusting the refractive index of the adhesion promoting layer to 1.57 to 1.63 to enhance the transmittance. Thus, such a combination is more preferred. The refractive index can be adjusted by coating a solution having an appropriate ratio of a binder resin to an oxide sol having a relatively high refractive index, such as a tin oxide sol or a cerium oxide sol. The adhesion promoting layer may be a monolayer or may have a multilayer structure for enhancing adhesiveness.

The light condensing layer can increase the amount of light received from a specific direction or, conversely, can reduce the dependence on the incident angle of sunlight by, for example, forming a microlens array structure on the sunlight receiving side of the support substrate or additionally providing a so-called light-condensing sheet.

In an example of the microlens array, quadrangular pyramids having a side length of 30 μm and a vertical angle of 90 degrees are two-dimensionally arrayed on the light-extracting side of the substrate. The side length is preferably 10 to 100 μm. A smaller side length than this range causes diffraction effects, resulting in coloring, whereas a larger side length than the range disadvantageously increases the thickness.

Examples of the light diffusion layer include various anti-glare layers and colorless transparent polymer layers containing nanoparticles or nanowires of a metal or an inorganic oxide dispersed therein.

[Patterning]

Any known method or process can be employed for patterning, for example, electrodes, power generation layer, hole transfer layer, and electron transfer layer according to the present invention without limitation.

If the constituent materials of, for example, the bulk-heterojunction layer and the transfer layers are soluble materials, unnecessary portions of the materials applied to the whole surfaces by die coating or dip coating may be wiped out, or predetermined regions may be directly patterned during the coating by, for example, ink jetting or screen printing.

For insoluble materials such as electrode materials, the electrode may be formed through a mask by vacuum deposition or may be patterned by a known method such as etching or lift-off. Alternatively, a pattern formed on another substrate may be transferred.

[Sealing]

In order to prevent the produced organic photoelectric conversion element from deterioration by oxygen, moisture, or other factors in the environment, not only the organic photoelectric conversion element but also other elements such as an organic electroluminescence element are preferably sealed by a known procedure. Examples of the sealing include a procedure of sealing by bonding an alumina cap or glass cap with an adhesive; a procedure of pasting plastic film provided with a gas barrier layer of, for example, aluminum, silicon oxide, or aluminum oxide to the organic photoelectric conversion element with an adhesive; a method of spin-coating an organic polymer material (e.g., polyvinyl alcohol) having high gas barrier properties; a method of depositing an inorganic thin film (e.g., silicon oxide or aluminum oxide) or organic film (e.g., parylene) having high gas barrier properties under vacuum; and a method of laminating them into a complex structure.

EXAMPLES

The present invention will now be specifically described by examples, but should not be limited thereto.

Example 1

Production of Organic Photoelectric Conversion Element (Production of Organic Photoelectric Conversion Element 101)

An indium tin oxide (ITO) transparent conductive thin film (sheet resistance: 12Ω/□) having a thickness of 150 nm was deposited on a polyethylene telephthalate (PET) substrate and was patterned to a width of 10 mm by usual photolithography and wet etching to form a first electrode. The patterned first electrode was washed by ultrasonication with a surfactant and ultrapure water and then ultrasonication with ultrapure water, was dried with a nitrogen blow, and was finally washed with UV ozone. After this washing process, the transparent substrate was placed into a glove box, and the subsequent steps were performed under nitrogen atmosphere.

A solution mixture of polyethyleneimine in isopropanol and glycerol propoxylate triglycidyl ether was applied onto the transparent substrate with a blade coater and dried so as to become a dry-thickness of about 5 nm. Subsequently, heat treatment on a hot plate at 120° C. was performed for 1 min to form an electron transfer layer.

Subsequently, 0.6% by mass of P3HT as a p-type organic semiconductor material, 1.2% by mass of PC71BM (nanom spectra E110, manufactured by Frontier Carbon Corporation) as an n-type semiconductor material and 2-bromotoluene as a solvent were mixed, and the mixture solution was heated in an oven at 70° C. while stirring (60 min) to dissolve the P3HT and the PC71BM in the 2-bromotoluene, followed by filtration through a filter of 0.45 μm to prepare material composition 101 for an organic photoelectric conversion layer. Subsequently, this material composition 101 for an organic photoelectric conversion layer was applied onto the electron transfer layer with a blade coater at a constant solution temperature of 50° C. and dried at a drying temperature of 50° C. for 3 minutes such that the dry-thickness became about 100 nm, to form an organic photoelectric conversion layer 101.

Subsequently, a solution containing PEDOT-PSS (CLEVIOS (registered trademark) P VP AI 4083, manufactured by Heraeus, conductivity: 1×10⁻³ S/cm), which is composed of a conductive polymer and polyanions, and isopropanol was prepared and was applied onto the organic photoelectric conversion layer 101 with a blade coater and dried to become a dry-thickness of about 30 nm. Subsequently, heat treatment with a hot air of 90° C. was performed for 20 sec to form a hole transfer layer.

The substrate provided with these functional layers was moved inside a vacuum deposition apparatus chamber. The element was set such that a shadow mask having a width of 10 mm was orthogonal to the transparent electrode. The internal pressure of the vacuum deposition apparatus was reduced to 1×10⁻³ Pa or less, and an Ag metal was layered at a deposition rate of 5.0 nm/sec to form a second electrode having a thickness of 200 nm. The resulting organic photoelectric conversion element was moved to a nitrogen chamber and was pinched between two transparent barrier films GX (manufactured by Toppan Printing Co., Ltd., water vapor transmission rate: 0.05 g/m²/d). After sealing with a UV cured resin (UV RESIN XNR5570-B1, manufactured by Nagase ChemteX Corporation), the element was taken out under the atmosphere to yield an organic photoelectric conversion element 101 having a light-receiving portion with a size of about 10×10 mm.

(Production of Organic Photoelectric Conversion Elements 102 to 132)

Organic photoelectric conversion elements 102 to 132 were produced in accordance with the production of the organic photoelectric conversion element 101 except that organic photoelectric conversion layers 102 to 132, of which the p-type organic semiconductor materials, the solvents, and the combination of solution temperature, drying temperature, and drying time of each material composition for an organic photoelectric conversion layer at the time of coating were changed as shown in Table 1, were used instead of the organic photoelectric conversion layer 101.

The structures for the p-type organic semiconductor materials used for producing the organic photoelectric conversion elements 101 to 132 are shown below.

[Chem. 4]

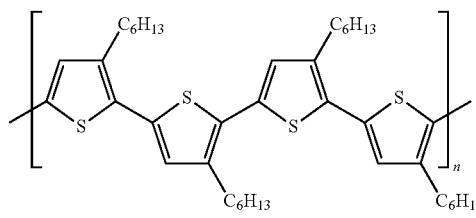

P3HT
Mw = 45,000 BAND GAP 2 eV

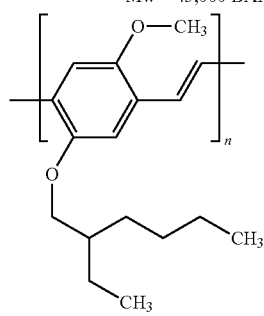

MEH-PPV
Mw = 45,000 BAND GAP 2.2 eV

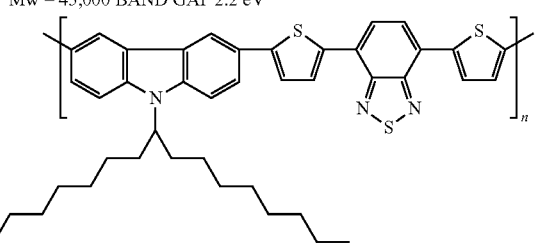

PCDTBT
Mw = 35,000 BAND GAP 1.85 eV

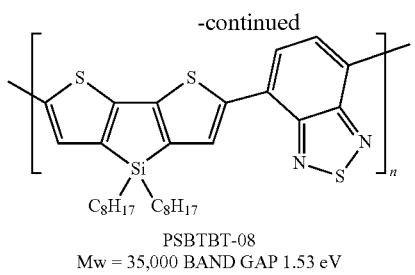

PSBTBT-08
Mw = 35,000 BAND GAP 1.53 eV

Evaluation of Organic Photoelectric Conversion Element (Evaluation of Photoelectric Conversion Efficiency)

Each of the sealed organic photoelectric conversion elements produced above was irradiated with light having an intensity of 100 mW/cm$^2$ with a Solar Simulator (AM 1.5 G filter). A mask having an effective area of 4.0 mm$^2$ was superposed on the light-receiving portion, and the short-circuit current density Jsc (mA/cm$^2$), open circuit voltage Voc (V), and fill factor FF were measured at four light-receiving portions formed on the element, and the averages thereof were calculated. The energy conversion efficiency η (%) was calculated from the Jsc, Voc, and FF in accordance with the following Expression (1):

$$\eta(\%) = Jsc(\text{mA/cm}^2) \times Voc(V) \times FF. \qquad \text{Expression (1):}$$

The results are shown in Table 1. A larger value of η (%) shows higher energy conversion efficiency (photoelectric conversion efficiency).

TABLE 1

| *1 | *2 | SOLVENT | *3 (° C.) | *4 (° C.) | DRYING TIME(ms) | *5 (%) | NOTE |
|---|---|---|---|---|---|---|---|
| 101 | P3HT | 2-BROMOTOLUENE | 50 | 50 | 3 | 3.0 | COMPARATIVE EXAMPLE |
| 102 | MEH-PPV | 2-BROMOTOLUENE | 50 | 50 | 3 | 2.0 | COMPARATIVE EXAMPLE |
| 103 | PCDTBT | 2-BROMOTOLUENE | 50 | 50 | 3 | 6.0 | PRESENT INVENTION |
| 104 | PSBTBT-08 | 2-BROMOTOLUENE | 50 | 50 | 3 | 8.0 | PRESENT INVENTION |
| 105 | P3HT | 2-BROMOTOLUENE | 70 | 95 | 1 | 0.5 | COMPARATIVE EXAMPLE |
| 106 | MEH-PPV | 2-BROMOTOLUENE | 70 | 95 | 1 | 0.3 | COMPARATIVE EXAMPLE |
| 107 | PCDTBT | 2-BROMOTOLUENE | 70 | 95 | 1 | 4.5 | PRESENT INVENTION |
| 108 | PSBTBT-08 | 2-BROMOTOLUENE | 70 | 95 | 1 | 7.0 | PRESENT INVENTION |
| 109 | P3HT | 3-CHLOROTHIOPHENE | 50 | 50 | 3 | 3.0 | COMPARATIVE EXAMPLE |
| 110 | MEH-PPV | 3-CHLOROTHIOPHENE | 50 | 50 | 3 | 2.0 | COMPARATIVE EXAMPLE |
| 111 | PCDTBT | 3-CHLOROTHIOPHENE | 50 | 50 | 3 | 6.0 | PRESENT INVENTION |
| 112 | PSBTBT-08 | 3-CHLOROTHIOPHENE | 50 | 50 | 3 | 8.0 | PRESENT INVENTION |
| 113 | P3HT | 3-CHLOROTHIOPHENE | 70 | 95 | 1 | 0.4 | COMPARATIVE EXAMPLE |
| 114 | MEH-PPV | 3-CHLOROTHIOPHENE | 70 | 95 | 1 | 0.2 | COMPARATIVE EXAMPLE |
| 115 | PCDTBT | 3-CHLOROTHIOPHENE | 70 | 95 | 1 | 4.5 | PRESENT INVENTION |
| 116 | PSBTBT-08 | 3-CHLOROTHIOPHENE | 70 | 95 | 1 | 6.5 | PRESENT INVENTION |
| 117 | P3HT | o-DICHLOROBENZENE | 50 | 50 | 3 | 2.0 | COMPARATIVE EXAMPLE |
| 118 | MEH-PPV | o-DICHLOROBENZENE | 50 | 50 | 3 | 1.5 | COMPARATIVE EXAMPLE |
| 119 | PCDTBT | o-DICHLOROBENZENE | 50 | 50 | 3 | 3.5 | COMPARATIVE EXAMPLE |
| 120 | PSBTBT-08 | o-DICHLOROBENZENE | 50 | 50 | 3 | 4.0 | COMPARATIVE EXAMPLE |
| 121 | P3HT | o-DICHLOROBENZENE | 70 | 95 | 1 | 0.3 | COMPARATIVE EXAMPLE |
| 122 | MEH-PPV | o-DICHLOROBENZENE | 70 | 95 | 1 | 0.2 | COMPARATIVE EXAMPLE |
| 123 | PCDTBT | o-DICHLOROBENZENE | 70 | 95 | 1 | 3.0 | COMPARATIVE EXAMPLE |
| 124 | PSBTBT-08 | o-DICHLOROBENZENE | 70 | 95 | 1 | 2.0 | COMPARATIVE EXAMPLE |
| 125 | P3HT | 3-METHYLTHIOPHENE | 50 | 50 | 3 | 3.5 | COMPARATIVE EXAMPLE |
| 126 | MEH-PPV | 3-METHYLTHIOPHENE | 50 | 50 | 3 | 2.0 | COMPARATIVE EXAMPLE |
| 127 | PCDTBT | 3-METHYLTHIOPHENE | 50 | 50 | 3 | 3.0 | COMPARATIVE EXAMPLE |
| 128 | PSBTBT-08 | 3-METHYLTHIOPHENE | 50 | 50 | 3 | 3.5 | COMPARATIVE EXAMPLE |
| 129 | P3HT | 3-METHYLTHIOPHENE | 70 | 95 | 1 | 0.5 | COMPARATIVE EXAMPLE |
| 130 | MEH-PPV | 3-METHYLTHIOPHENE | 70 | 95 | 1 | 0.4 | COMPARATIVE EXAMPLE |
| 131 | PCDTBT | 3-METHYLTHIOPHENE | 70 | 95 | 1 | 1.0 | COMPARATIVE EXAMPLE |
| 132 | PSBTBT-08 | 3-METHYLTHIOPHENE | 70 | 95 | 1 | 2.0 | COMPARATIVE EXAMPLE |

*1: ORGANIC PHOTOELECTRIC CONVERSION ELEMENT No.
*2: p-TYPE ORGANIC SEMICONDUCTOR MATERIAL
*3: SOLUTION TEMPERATURE
*4: DRYING TEMPERATURE
*5: PHOTOELECTRIC CONVERSION EFFICIENCY

The results in Table 1 evidentially demonstrate that the organic photoelectric conversion elements produced using the material compositions for organic photoelectric conversion layers of the present invention each containing a p-type conjugated polymer semiconductor material having a main chain including an electron-donating group and an electron-withdrawing group, an n-type organic semiconductor material having electron acceptability, and a solvent having the specific structure according to the present invention have high photoelectric conversion efficiency despite a short drying time. On the contrary, the organic photoelectric conversion elements produced using the material compositions for organic photoelectric conversion layers each containing a p-type conjugated polymer semiconductor material having a main chain not including any electron-donating group and electron-withdrawing group or a solvent not having any specific structure according to the present invention do not show such effects.

Example 2

Production of Organic Photoelectric Conversion Element (Production of Organic Photoelectric Conversion Element 201)

An organic photoelectric conversion element 201 was produced in similar way to the organic photoelectric conversion element 103 described in Example 1 except that an organic photoelectric conversion layer 201 formed by the method described below was used in place of the organic photoelectric conversion layer 103.

<Formation of Organic Photoelectric Conversion Layer 201>

A mixture solution of 0.6% by mass of PCPDTBT shown below as a p-type organic semiconductor material, 1.2% by mass of PC71BM (nanom spectra E110, manufactured by Frontier Carbon Corporation) as an n-type semiconductor material, and 2-bromotoluene as a solvent was prepared, and the mixture was heated in an oven at 70° C. while stirring (60 min) so as to dissolve the PCPDTBT and the PC71BM in the 2-bromotoluene, followed by filtration through a filter of 0.45 μm to prepare material composition 201 for an organic photoelectric conversion layer. Subsequently, this material composition 201 for an organic photoelectric conversion layer was applied onto the electron transfer layer with a blade coater at a constant solution temperature of 50° C. such that a dry-thickness became about 100 nm, followed by drying at a drying temperature of 50° C. for 3 minutes to form an organic photoelectric conversion layer 201.

[Chem. 5]

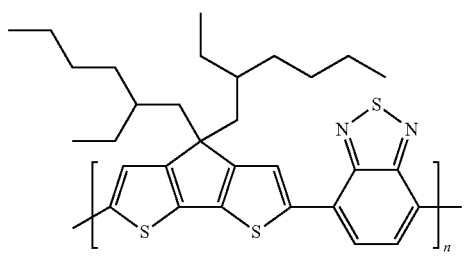

PCPDTBT
Mw = 30,000 BAND GAP 1.41 eV (Production of Organic Photoelectric Conversion Elements 202 to 239)

Organic photoelectric conversion elements 202 to 239 were produced in similar way to that of the organic photoelectric conversion element 201 except that the solvents (a part of them is a combination of two solvents) shown in Tables 2 and 3 were used in place of the solvent for the material composition 201 for an organic photoelectric conversion layer used in formation of the organic photoelectric conversion layer 201.

Evaluation of Organic Photoelectric Conversion Element (Evaluation of Photoelectric Conversion Efficiency)

The photoelectric conversion efficiency was evaluated in the same way as the method described in Example 1. The results are shown in Tables 2 and 3.

(Evaluation of Durability of Photoelectric Conversion Efficiency: Measurement of Relative Rate of Decrease in Photoelectric Conversion Efficiency)

Each organic photoelectric conversion element was irradiated with light having an intensity of 100 mW/cm$^2$ with a Solar Simulator (AM 1.5 G). The voltage-current characteristics were measured, and the photoelectric conversion efficiency before the exposure was determined. Subsequently, the organic photoelectric conversion element was heated to 80° C. while keeping a resistance connected between the anode and the cathode and was irradiated with light having an intensity of 1000 mW/cm$^2$, i.e., 10 times that of the above irradiation, with a Solar Simulator (AM 1.5 G) continuously for 100 hours. The organic photoelectric conversion element was then cooled to room temperature and was irradiated with light having an intensity of 100 mW/cm$^2$ with a Solar Simulator (AM 1.5 G). The voltage-current characteristics were measured, and the photoelectric conversion efficiency after the exposure was determined. The relative rate of decrease (%) in the photoelectric conversion efficiency was calculated by the following expression (2) and was used as a criterion of the durability of the photoelectric conversion efficiency.

Relative rate of decrease (%) in photoelectric conversion efficiency={1−(photoelectric conversion efficiency after exposure)/(photoelectric conversion efficiency before exposure)}×100.  Expression (2):

The results of evaluation are shown in Tables 2 and 3. A lower relative rate of decrease (%) in photoelectric conversion efficiency shows higher durability of energy conversion efficiency (durability of photoelectric conversion efficiency).

TABLE 2

| *1 | SOLVENT 1 TYPE | *2 | SOLVENT 2 TYPE | *2 | *5 (° C.) | *6 (° C.) | DRYING TIME(ms) | *7 (%) | *8 (%) | NOTE |
|---|---|---|---|---|---|---|---|---|---|---|
| 201 | 2-BROMOTOLUENE | 100 | NONE | — | 50 | 50 | 3 | 6.9 | 15 | PRESENT INVENTION |
| 202 | 3-BROMOTOLUENE | 100 | NONE | — | 50 | 50 | 3 | 6.9 | 15 | PRESENT INVENTION |
| 203 | 2-BROMO-o-XYLENE | 100 | NONE | — | 50 | 50 | 3 | 6.7 | 15 | PRESENT INVENTION |
| 204 | 4-BROMO-o-XYLENE | 100 | NONE | — | 50 | 50 | 3 | 6.7 | 15 | PRESENT INVENTION |
| 205 | 2,4-DIBROMOTOLUENE | 100 | NONE | — | 50 | 50 | 3 | 6.7 | 20 | PRESENT INVENTION |
| 206 | 3,4-DIBROMOTOLUENE | 100 | NONE | — | 50 | 50 | 3 | 6.7 | 20 | PRESENT INVENTION |
| 207 | 1-BROMO-4-ETHYLBENZENE | 100 | NONE | — | 50 | 50 | 3 | 6.8 | 20 | PRESENT INVENTION |
| 208 | 1-BROMO-2-ETHYLBENZENE | 100 | NONE | — | 50 | 50 | 3 | 6.8 | 20 | PRESENT INVENTION |
| 209 | 2-CHLOROTOLUENE | 100 | NONE | — | 50 | 50 | 3 | 6.7 | 20 | PRESENT INVENTION |
| 210 | 3-CHLOROTOLUENE | 100 | NONE | — | 50 | 50 | 3 | 6.7 | 20 | PRESENT INVENTION |
| 211 | 2-CHLORO-o-XYLENE | 100 | NONE | — | 50 | 50 | 3 | 6.6 | 25 | PRESENT INVENTION |
| 212 | 4-CHLORO-o-XYLENE | 100 | NONE | — | 50 | 50 | 3 | 6.6 | 25 | PRESENT INVENTION |
| 213 | 2,4-DICHLOROTOLUENE | 100 | NONE | — | 50 | 50 | 3 | 6.6 | 25 | PRESENT INVENTION |
| 214 | 3,4-DICHLOROTOLUENE | 100 | NONE | — | 50 | 50 | 3 | 6.6 | 25 | PRESENT INVENTION |
| 215 | 3-BROMOTHIOPHENE | 100 | NONE | — | 50 | 50 | 3 | 6.5 | 20 | PRESENT INVENTION |
| 216 | 2-BROMOTHIOPHENE | 100 | NONE | — | 50 | 50 | 3 | 6.4 | 20 | PRESENT INVENTION |
| 217 | 3,4-DIBROMOTHIOPHENE | 100 | NONE | — | 50 | 50 | 3 | 6.3 | 20 | PRESENT INVENTION |
| 218 | 2,3-DIBROMOTHIOPHENE | 100 | NONE | — | 50 | 50 | 3 | 6.3 | 20 | PRESENT INVENTION |
| 219 | 3-CHLOROTHIOPHENE | 100 | NONE | — | 50 | 50 | 3 | 6.4 | 20 | PRESENT INVENTION |
| 220 | 2-CHLOROTHIOPHENE | 100 | NONE | — | 50 | 50 | 3 | 6.3 | 20 | PRESENT INVENTION |
| 221 | 2,5-DICHLOROTHIOPHENE | 100 | NONE | — | 50 | 50 | 3 | 6.2 | 25 | PRESENT INVENTION |
| 222 | 3-BROMOFURAN | 100 | NONE | — | 50 | 50 | 3 | 6.9 | 15 | PRESENT INVENTION |
| 223 | 2,5-DIBROMOFURAN | 100 | NONE | — | 50 | 50 | 3 | 6.8 | 15 | PRESENT INVENTION |
| 224 | 4-BROMO-o-XYLENE | 70 | *3 | 30 | 50 | 50 | 3 | 6.9 | 15 | PRESENT INVENTION |
| 225 | 3-CHLOROTHIOPHENE | 70 | *4 | 30 | 50 | 50 | 3 | 6.6 | 20 | PRESENT INVENTION |
| 226 | CHLOROBENZENE | 100 | NONE | — | 50 | 50 | 3 | 2.7 | 40 | COMPARATIVE EXAMPLE |
| 227 | O-DICHLOROBENZENE | 100 | NONE | — | 50 | 50 | 3 | 2.8 | 40 | COMPARATIVE EXAMPLE |

*1: ORGANIC PHOTOELECTRIC CONVERSION ELEMENT No.
*2: PARTS BY VOLUME
*3: 1-CHLORONAPHTHALENE
*4: o-XYLENE
*5: SOLUTION TEMPERATURE
*6: DRYING TEMPERATURE
*7: PHOTOELECTRIC CONVERSION EFFICIENCY
*8: RELATIVE RATE OF DECREASE IN PHOTOELECTRIC CONVERSION EFFICIENCY

TABLE 3

| *1 | SOLVENT 1 TYPE | *2 | SOLVENT 2 TYPE | *2 | *3 (° C.) | *4 (° C.) | DRYING TIME(ms) | *5 (%) | *6 (%) | NOTE |
|---|---|---|---|---|---|---|---|---|---|---|
| 228 | BROMOBENZENE | 100 | NONE | — | 50 | 50 | 3 | 2.7 | 40 | COMPARATIVE EXAMPLE |
| 229 | TOLUENE | 100 | NONE | — | 50 | 50 | 3 | 1.8 | 50 | COMPARATIVE EXAMPLE |
| 230 | o-XYLENE | 100 | NONE | — | 50 | 50 | 3 | 2.7 | 50 | COMPARATIVE EXAMPLE |
| 231 | 3-METHYLTHIOPHENE | 100 | NONE | — | 50 | 50 | 3 | 4.5 | 40 | COMPARATIVE EXAMPLE |
| 232 | 3-METHYLFURAN | 100 | NONE | — | 50 | 50 | 3 | 4.5 | 50 | COMPARATIVE EXAMPLE |
| 233 | OCTANETHIOL | 100 | NONE | — | 50 | 50 | 3 | 4.0 | 60 | COMPARATIVE EXAMPLE |
| 234 | CHLOROBENZENE | 20 | o-DICHLOROBENZENE | 80 | 50 | 50 | 3 | 5.2 | 40 | COMPARATIVE EXAMPLE |
| 235 | CHLOROBENZENE | 70 | DIMETHYLFORMAMIDE | 30 | 50 | 50 | 3 | 5.1 | 40 | COMPARATIVE EXAMPLE |
| 236 | o-DICHLOROBENZENE | 85 | 1-CHLORONAPHTHALENE | 15 | 50 | 50 | 3 | 5.3 | 50 | COMPARATIVE EXAMPLE |
| 237 | CHLOROBENZENE | 98 | OCTANETHIOL | 2 | 50 | 50 | 3 | 5.2 | 50 | COMPARATIVE EXAMPLE |
| 238 | o-XYLENE | 80 | TETRALIN | 20 | 50 | 50 | 3 | 5.0 | 50 | COMPARATIVE EXAMPLE |
| 239 | CHLOROBENZENE | 20 | 1,8-OCTANEDITHIOL | 80 | 50 | 50 | 3 | 5.5 | 50 | COMPARATIVE EXAMPLE |

*1: ORGANIC PHOTOELECTRIC CONVERSION ELEMENT No.
*2: PARTS BY VOLUME
*3: SOLUTION TEMPERATURE
*4: DRYING TEMPERATURE
*5: PHOTOELECTRIC CONVERSION EFFICIENCY
*6: RELATIVE RATE OF DECREASE IN PHOTOELECTRIC CONVERSION EFFICIENCY

As obvious from the results shown in Tables 2 and 3, the organic photoelectric conversion elements produced using the material compositions for organic photoelectric conversion layers of the present invention each containing a solvent having the specific structure according to the present invention have high photoelectric conversion efficiency and excellent durability (durability of photoelectric conversion efficiency). On the contrary, the photoelectric conversion elements produced using the material compositions for organic photoelectric conversion layers each containing a solvent other than the specific solvent according to the present invention do not show such effects.

Example 3

Production of Organic Photoelectric Conversion Element (Production of Organic Photoelectric Conversion Element 301 to 339)

Organic photoelectric conversion elements 301 to 339 were produced by producing the respective organic photoelectric conversion layers in similar ways to those for the organic photoelectric conversion elements 201 to 239 described in Example 2 except that the coating solution temperature of the material composition for an organic photoelectric conversion layer at the time of formation of each organic photoelectric conversion layer was 70° C. instead of 50° C., the drying temperature for drying the coating film was 70° C. instead of 50° C., and the drying time was 1 minute instead of 3 minutes.

Evaluation of Organic Photoelectric Conversion Element

Evaluation of the photoelectric conversion efficiency and evaluation of the durability of the photoelectric conversion efficiency (measurement of the relative rate of decrease in photoelectric conversion efficiency) were performed as in Example 2. The results are shown in Tables 4 and 5.

TABLE 4

| *1 | SOLVENT 1 TYPE | *2 | SOLVENT 2 TYPE | *2 | *5 (° C.) | *6 (° C.) | DRYING TIME(ms) | *7 (%) | *8 (%) | NOTE |
|---|---|---|---|---|---|---|---|---|---|---|
| 301 | 2-BROMOTOLUENE | 100 | NONE | — | 70 | 95 | 1 | 6.7 | 20 | PRESENT INVENTION |
| 302 | 3-BROMOTOLUENE | 100 | NONE | — | 70 | 95 | 1 | 6.7 | 20 | PRESENT INVENTION |
| 303 | 2-BROMO-o-XYLENE | 100 | NONE | — | 70 | 95 | 1 | 6.6 | 20 | PRESENT INVENTION |
| 304 | 4-BROMO-o-XYLENE | 100 | NONE | — | 70 | 95 | 1 | 6.6 | 20 | PRESENT INVENTION |
| 305 | 2,4-DIBROMOTOLUENE | 100 | NONE | — | 70 | 95 | 1 | 6.6 | 25 | PRESENT INVENTION |
| 306 | 3,4-DIBROMOTOLUENE | 100 | NONE | — | 70 | 95 | 1 | 6.6 | 25 | PRESENT INVENTION |
| 307 | 1-BROMO-4-ETHYLBENZENE | 100 | NONE | — | 70 | 95 | 1 | 6.7 | 25 | PRESENT INVENTION |
| 308 | 1-BROMO-2-ETHYLBENZENE | 100 | NONE | — | 70 | 95 | 1 | 6.7 | 25 | PRESENT INVENTION |
| 309 | 2-CHLOROTOLUENE | 100 | NONE | — | 70 | 95 | 1 | 6.6 | 25 | PRESENT INVENTION |
| 310 | 3-CHLOROTOLUENE | 100 | NONE | — | 70 | 95 | 1 | 6.6 | 25 | PRESENT INVENTION |
| 311 | 2-CHLORO-o-XYLENE | 100 | NONE | — | 70 | 95 | 1 | 6.5 | 30 | PRESENT INVENTION |
| 312 | 4-CHLORO-o-XYLENE | 100 | NONE | — | 70 | 95 | 1 | 6.5 | 30 | PRESENT INVENTION |
| 313 | 2,4-DICHLOROTOLUENE | 100 | NONE | — | 70 | 95 | 1 | 6.5 | 30 | PRESENT INVENTION |
| 314 | 3,4-DICHLOROTOLUENE | 100 | NONE | — | 70 | 95 | 1 | 6.5 | 30 | PRESENT INVENTION |
| 315 | 3-BROMOTHIOPHENE | 100 | NONE | — | 70 | 95 | 1 | 6.4 | 25 | PRESENT INVENTION |
| 316 | 2-BROMOTHIOPHENE | 100 | NONE | — | 70 | 95 | 1 | 6.3 | 25 | PRESENT INVENTION |
| 317 | 3,4-DIBROMOTHIOPHENE | 100 | NONE | — | 70 | 95 | 1 | 6.2 | 25 | PRESENT INVENTION |
| 318 | 2,3-DIBROMOTHIOPHENE | 100 | NONE | — | 70 | 95 | 1 | 6.2 | 25 | PRESENT INVENTION |
| 319 | 3-CHLOROTHIOPHENE | 100 | NONE | — | 70 | 95 | 1 | 6.3 | 25 | PRESENT INVENTION |
| 320 | 2-CHLOROTHIOPHENE | 100 | NONE | — | 70 | 95 | 1 | 6.2 | 25 | PRESENT INVENTION |
| 321 | 2,5-DICHOLORTHIOPHENE | 100 | NONE | — | 70 | 95 | 1 | 6.1 | 30 | PRESENT INVENTION |
| 322 | 3-BROMOFURAN | 100 | NONE | — | 70 | 95 | 1 | 6.7 | 20 | PRESENT INVENTION |
| 323 | 2,5-DIBROMOFURAN | 100 | NONE | — | 70 | 95 | 1 | 6.7 | 20 | PRESENT INVENTION |
| 324 | 4-BROMO-o-XYLENE | 70 | *3 | 30 | 70 | 95 | 1 | 6.7 | 20 | PRESENT INVENTION |
| 325 | 3-CHLOROTHIOPHENE | 70 | *4 | 30 | 70 | 95 | 1 | 6.5 | 25 | PRESENT INVENTION |
| 326 | CHLOROBENZENE | 100 | NONE | — | 70 | 95 | 1 | 1.1 | 50 | COMPARATIVE EXAMPLE |
| 327 | o-DICHLOROBENZENE | 100 | NONE | — | 70 | 95 | 1 | 1.1 | 50 | COMPARATIVE EXAMPLE |

*1: ORGANIC PHOTOELECTRIC CONVERSION ELEMENT No.
*2: PARTS BY VOLUME
*3: 1-CHLORONAPHTHALENE
*4: o-XYLENE
*5: SOLUTION TEMPERATURE
*6: DRYING TEMPERATURE
*7: PHOTOELECTRIC CONVERSION EFFICIENCY
*8: RELATIVE RATE OF DECREASE IN PHOTOELECTRIC CONVERSION EFFICIENCY

TABLE 5

| *1 | SOLVENT 1 TYPE | *2 | SOLVENT 2 TYPE | *2 | *3 (° C.) | *4 (° C.) | DRYING TIME(ms) | *5 (%) | *6 (%) | NOTE |
|---|---|---|---|---|---|---|---|---|---|---|
| 228 | BROMOBENZENE | 100 | NONE | — | 70 | 95 | 1 | 1.1 | 50 | COMPARATIVE EXAMPLE |
| 229 | TOLUENE | 100 | NONE | — | 70 | 95 | 1 | 0.5 | 60 | COMPARATIVE EXAMPLE |
| 230 | o-XYLENE | 100 | NONE | — | 70 | 95 | 1 | 1.1 | 60 | COMPARATIVE EXAMPLE |
| 231 | 3-METHYLTHIOPHENE | 100 | NONE | — | 70 | 95 | 1 | 1.8 | 50 | COMPARATIVE EXAMPLE |
| 232 | 3-METHYLFURAN | 100 | NONE | — | 70 | 95 | 1 | 1.8 | 60 | COMPARATIVE EXAMPLE |
| 233 | OCTANETHIOL | 100 | NONE | — | 70 | 95 | 1 | 3.8 | 70 | COMPARATIVE EXAMPLE |
| 234 | CHLOROBENZENE | 20 | o-DICHLOROBENZENE | 80 | 70 | 95 | 1 | 4.9 | 50 | COMPARATIVE EXAMPLE |
| 235 | CHLOROBENZENE | 70 | DIMETHYLFORMAMIDE | 30 | 70 | 95 | 1 | 4.9 | 50 | COMPARATIVE EXAMPLE |
| 236 | o-DICHLOROBENZENE | 85 | 1-CHLORONAPHTHALENE | 15 | 70 | 95 | 1 | 5.0 | 60 | COMPARATIVE EXAMPLE |
| 237 | CHLOROBENZENE | 98 | OCTANETHIOL | 2 | 70 | 95 | 1 | 4.9 | 60 | COMPARATIVE EXAMPLE |
| 238 | o-XYLENE | 80 | TETRALIN | 20 | 70 | 95 | 1 | 4.8 | 60 | COMPARATIVE EXAMPLE |
| 239 | CHLOROBENZENE | 20 | 1,8-OCTANEDITHIOL | 80 | 70 | 95 | 1 | 5.2 | 60 | COMPARATIVE EXAMPLE |

*1: ORGANIC PHOTOELECTRIC CONVERSION ELEMENT No.
*2: PARTS BY VOLUME
*3: SOLUTION TEMPERATURE
*4: DRYING TEMPERATURE
*5: PHOTOELECTRIC CONVERSION EFFICIENCY
*6: RELATIVE RATE OF DECREASE IN PHOTOELECTRIC CONVERSION EFFICIENCY

The results shown in Tables 4 and 5 evidentially demonstrate that the organic photoelectric conversion elements of the present invention produced using the material compositions for organic photoelectric conversion layers of the present invention each containing a solvent having the specific structure according to the present invention have high photoelectric conversion efficiency and excellent durability (durability of photoelectric conversion efficiency) despite a short drying time of 1 minute.

INDUSTRIAL APPLICABILITY

The material composition for a bulk-heterojunction-type organic photoelectric conversion layer of the present invention has high photoelectric conversion efficiency and excellent durability (durability of photoelectric conversion efficiency) and can be suitably applied to organic photoelectric conversion elements and solar cells.

REFERENCE SIGNS LIST

10: organic photoelectric conversion element
11: substrate
12: transparent electrode
13: counter electrode
14: photoelectric conversion layer
15: charge recombination layer
16: second photoelectric conversion layer
17: hole transfer layer
18: electron transfer layer
19: first photoelectric conversion layer

The invention claimed is:

1. A material composition for an organic photoelectric conversion layer, comprising:
   a p-type conjugated polymer semiconductor material being a copolymer having a main chain comprising an electron-donating group and an electron-withdrawing group;
   an n-type organic semiconductor material having electron acceptability; and
   a solvent, wherein
   the solvent comprises
   at least one selected from the group consisting of: 2-chlorothiophene, 3-chlorothiophene, 2,5-dichlorothiophene, 2-bromothiophene, 3-bromothiophene, 2,3-dibromothiophene, 3,4-dibromothiophene, 3-bromofuran, and 2,5-dibromofuran,
   wherein the electron-donating group in the p-type conjugated polymer semiconductor material has a structure represented by at least one of general formula (2) and general formula (3), or a carbazole moiety; and
   the electron-withdrawing group in the p-type conjugated polymer semiconductor material has a structure selected from the group consisting of: a benzoselenadiazole skeleton, a 3,4-thiophenedicarboxylic acid imide skeleton, an isoindigo skeleton, a diketopyrrolopyrrole skeleton, a 4-acyl-thieno[3,4-b]thiophene skeleton, a pyrazolo[5, 1-c] [1,2,4] triazole skeleton, and a benzothiazole skeleton,

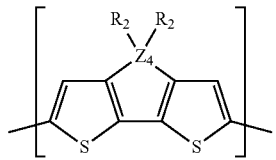

General Formula (2)

wherein $Z_4$ represents a carbon atom, a silicon atom, or a germanium atom; and each $R_2$ represents an alkyl group, a fluorinated alkyl group, a cycloalkyl group, an aryl group, a heteroaryl group, or an alkylsilyl group, and may be substituted, where two $R_2$s may be bonded together to form a ring and may be the same or different,

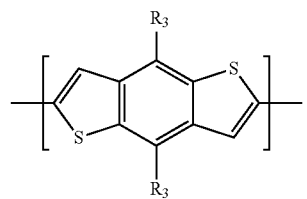

General Formula (3)

wherein $R_3$ represents an alkyl group, an alkylether group, or an alkylester group and may be substituted, where two $R_3$s may be bonded together to form a ring and may be the same or different.

2. The material composition for an organic photoelectric conversion layer of claim 1, wherein the solvent is contained in a range of 43 to 99% by mass to a total mass of the material composition for an organic photoelectric conversion layer.

3. The material composition for an organic photoelectric conversion layer of claim 1, wherein the p-type organic semiconductor material and the n-type organic semiconductor material are contained in a mixing ratio of 2:8 to 8:2 by mass.

4. The material composition for an organic photoelectric conversion layer of claim 1, wherein a concentration of solid content is 1 to 15% by mass.

5. A method for producing an organic photoelectric conversion element, comprising:
   applying the material composition for an organic photoelectric conversion layer of claim 1, which being heated to 50° C. or more; and
   drying the applied material composition at 90° C. or more to form an organic photoelectric conversion layer.

6. The material composition for an organic photoelectric conversion layer of claim 1, wherein the p-type conjugated polymer semiconductor material is PCDTBT (poly[N-9"-heptadecanyl-2,7-carbazole-alt-5,5-(4',7'-di-2-thienyl-2',1', 3'-benzothiadiazole)]):

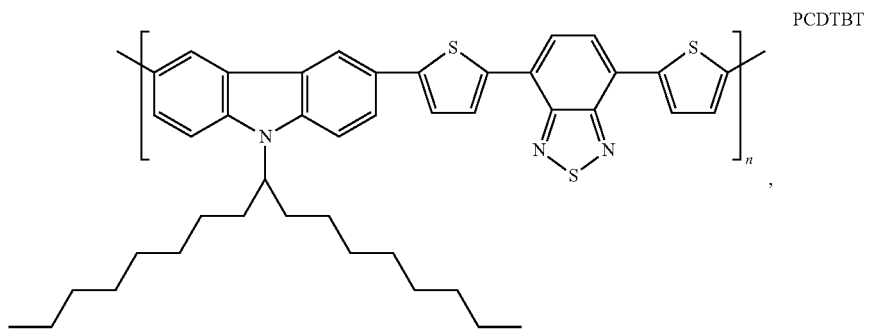
PCDTBT
wherein n is an integer.
7. The material composition for an organic photoelectric conversion layer of claim 1, wherein the solvent is at least one of 2-chlorothiophene and 3-chlorothiophene.
* * * * *